(12) United States Patent
McGrath et al.

(10) Patent No.: US 7,526,260 B2
(45) Date of Patent: Apr. 28, 2009

(54) APPARATUS, METHODS AND ARTICLES OF MANUFACTURE FOR LINEAR SIGNAL MODIFICATION

(75) Inventors: Finbarr Joseph McGrath, Wesford, MA (US); Pierce Joseph Nagle, Cork City (IE)

(73) Assignees: M/A-Com Eurotec, B.V., Blackrock, County of Cork (IE); M/A-Com, Inc., Lowell, MA (US)

( * ) Notice: Subject to any disclaimer, the term of this patent is extended or adjusted under 35 U.S.C. 154(b) by 836 days.

(21) Appl. No.: 10/294,358

(22) Filed: Nov. 14, 2002

(65) Prior Publication Data

US 2004/0097213 A1 May 20, 2004

(51) Int. Cl.
*H04B 1/04* (2006.01)
*H03H 7/24* (2006.01)

(52) U.S. Cl. .................. 455/127.2; 455/574; 455/127.5; 330/295

(58) Field of Classification Search .................. 455/574, 455/592, 108, 116, 127.1, 127.5, 343.1, 343.2, 455/343.5, 127.2, 127.3; 375/319, 320, 300; 330/295
See application file for complete search history.

(56) References Cited

U.S. PATENT DOCUMENTS

| | | | |
|---|---|---|---|
| 3,906,246 A | 9/1975 | Okada | 307/229 |
| 3,978,422 A | 8/1976 | Rheinfelder | |
| 4,415,862 A | 11/1983 | Kunugi | 330/10 |
| 4,580,111 A | 4/1986 | Swanson | |
| 4,586,000 A | 4/1986 | Wagner | |
| 4,646,359 A | 2/1987 | Furrer | |
| 4,804,931 A | 2/1989 | Hulick | 332/31 R |
| 4,947,455 A | 8/1990 | Swanson | 455/115 |
| 4,952,890 A | 8/1990 | Swanson | 332/152 |
| 5,268,658 A | 12/1993 | Edwards | 332/151 |
| 5,278,997 A | 1/1994 | Martin | |
| 5,311,143 A | 5/1994 | Soliday | |
| 5,367,272 A | 11/1994 | Hulick | 332/149 |
| 5,392,007 A | 2/1995 | Cripe | 332/149 |
| 5,410,280 A | 4/1995 | Linguet et al. | |
| 5,450,044 A | 9/1995 | Hulick | 332/103 |
| 5,469,127 A | 11/1995 | Hulick et al. | 332/149 |
| 5,612,647 A * | 3/1997 | Malec | 330/146 |
| 5,621,351 A | 4/1997 | Puri et al. | 330/10 |
| 5,642,002 A | 6/1997 | Mekanik et al. | |
| 5,774,017 A | 6/1998 | Adar | |

(Continued)

FOREIGN PATENT DOCUMENTS

EP    1096 670 A2 *    2/2001

(Continued)

OTHER PUBLICATIONS

Hulick, "The Digital Linear Amplifier", Schwenksville, Pennsylvania.

(Continued)

*Primary Examiner*—Blane J Jackson

(57) ABSTRACT

Apparatus, method and article of manufacture are shown for linear signal modification. An input signal is modified by providing one or more non-linear current sources and regulating at least one of the one or more current sources to output a signal based on one or more of the input signal characteristics. The modification of the output signal includes both amplification and attenuation.

50 Claims, 4 Drawing Sheets

U.S. PATENT DOCUMENTS

| | | | |
|---|---|---|---|
| 5,818,298 | A | 10/1998 | Dent et al. |
| 5,867,071 | A | 2/1999 | Chethik ............... 332/103 |
| 5,867,778 | A | 2/1999 | Khoury et al. ............. 455/333 |
| 5,880,633 | A | 3/1999 | Leizerovich et al. |
| 5,886,573 | A | 3/1999 | Kolanek ............... 350/10 |
| 5,892,431 | A | 4/1999 | Osterman |
| 5,903,854 | A | 5/1999 | Abe et al. |
| 5,930,128 | A | 7/1999 | Dent |
| 5,939,951 | A | 8/1999 | Bateman et al. |
| 5,942,946 | A | 8/1999 | Su et al. |
| 5,952,895 | A | 9/1999 | McCune, Jr. et al. |
| 6,041,082 | A | 3/2000 | Takeda et al. ............. 375/300 |
| 6,043,707 | A | 3/2000 | Budnik |
| 6,043,712 | A | 3/2000 | Leizerovich et al. |
| 6,075,413 | A | 6/2000 | Katakura |
| 6,078,628 | A | 6/2000 | Griffith et al. |
| 6,094,101 | A | 7/2000 | Sander et al. |
| 6,097,252 | A | 8/2000 | Sigmon et al. |
| 6,101,224 | A | 8/2000 | Lindoff et al. |
| 6,112,071 | A | 8/2000 | McCune, Jr. |
| 6,130,910 | A | 10/2000 | Anderson et al. ............. 375/238 |
| 6,133,788 | A | 10/2000 | Dent |
| 6,140,875 | A | 10/2000 | Van Den Homberg et al. |
| 6,140,882 | A | 10/2000 | Sander |
| 6,147,553 | A | 11/2000 | Kolanek |
| 6,157,681 | A | 12/2000 | Daniel et al. |
| 6,191,653 | B1 | 2/2001 | Camp, Jr. et al. |
| 6,198,347 | B1 | 3/2001 | Sander et al. |
| 6,201,452 | B1 | 3/2001 | Dent et al. |
| 6,215,355 | B1 | 4/2001 | Meck et al. |
| 6,219,394 | B1 | 4/2001 | Sander |
| 6,236,284 | B1 | 5/2001 | Duello et al. |
| 6,242,975 | B1 | 6/2001 | Eidson et al. |
| 6,246,286 | B1 | 6/2001 | Persson |
| 6,255,906 | B1 | 7/2001 | Eidson et al. |
| 6,259,901 | B1 | 7/2001 | Shinomiya et al. |
| 6,269,135 | B1 | 7/2001 | Sander |
| 6,285,251 | B1 | 9/2001 | Dent et al. |
| 6,288,916 | B1 | 9/2001 | Liu et al. |
| 6,294,957 | B1 | 9/2001 | Luu |
| 6,311,046 | B1 | 10/2001 | Dent |
| 6,317,608 | B1 | 11/2001 | Glöcker |
| 6,321,072 | B1 | 11/2001 | Cipriani et al. |
| 6,323,731 | B1 | 11/2001 | McCune, Jr. |
| 6,356,155 | B1 | 3/2002 | Judkins |
| 6,366,177 | B1 | 4/2002 | McCune et al. |
| 6,369,657 | B2 | 4/2002 | Dening et al. |
| 6,377,784 | B2 | 4/2002 | McCune |
| 6,380,802 | B1 | 4/2002 | Pehike et al. |
| 6,404,823 | B1 | 6/2002 | Grange et al. |
| 6,411,655 | B1 | 6/2002 | Holden et al. |
| 6,426,677 | B1 | 7/2002 | Prentice |
| 6,426,678 | B1 | 7/2002 | Ko |
| 6,430,402 | B1 | 8/2002 | Agahi-Kesheh |
| 6,445,247 | B1 | 9/2002 | Walker |
| 6,449,465 | B1 | 9/2002 | Gailus et al. |
| 6,509,825 | B1 | 1/2003 | Smit et al. ............. 340/5.2 |
| 6,567,475 | B1 | 5/2003 | Dent et al. |
| 6,636,112 | B1 | 10/2003 | McCune ............... 330/10 |
| 6,658,238 | B1 | 12/2003 | Ursenbach et al. .......... 455/102 |
| 6,683,511 | B2 * | 1/2004 | Souetinov et al. ......... 333/81 R |
| 6,738,432 | B2 | 5/2004 | Pehlke et al. ............. 375/300 |
| 6,791,417 | B2 | 9/2004 | Pengelly et al. ............. 330/295 |
| 6,799,020 | B1 | 9/2004 | Heidmann et al. .......... 455/103 |
| 6,816,008 | B2 | 11/2004 | Kontson ............... 330/51 |
| 6,816,016 | B2 * | 11/2004 | Sander et al. ............. 330/295 |
| 6,819,171 | B2 * | 11/2004 | Kenington ............. 330/51 |
| 6,891,440 | B2 | 5/2005 | Straub et al. |
| 7,158,587 | B2 | 1/2007 | Yang et al. |
| 2002/0109495 | A1 | 8/2002 | Antone et al. |
| 2002/0132652 | A1 * | 9/2002 | Steel et al. ............. 455/574 |
| 2002/0136325 | A1 | 9/2002 | Pehlke et al. ............. 375/300 |
| 2003/0053565 | A1 | 3/2003 | Yange et al. |
| 2004/0022339 | A1 | 2/2004 | Nakao |
| 2004/0052323 | A1 | 3/2004 | Zhang |
| 2004/0217790 | A1 | 11/2004 | Saeki |
| 2004/0247040 | A1 | 12/2004 | Dennis et al. |
| 2004/0247047 | A1 | 12/2004 | Dennis et al. |
| 2005/0030104 | A1 | 2/2005 | Chen et al. ............. 330/295 |

FOREIGN PATENT DOCUMENTS

| | | |
|---|---|---|
| EP | 1 096 670 A2 | 5/2001 |
| EP | 1096670 A2 * | 5/2001 |
| WO | WO 01/10013 A1 | 2/2001 |

OTHER PUBLICATIONS

Kozyrey, "Single-Ended Switching-Mode Tuned Power Amplifier with Filtering Circuit", Poluprovodnikovye pribory v tekhnike svyazi, 1971, pp. 152-166, vol. 6.

TimeStar™, "Multi-Mode Polar Modulator" 2002, Tropian Headquarters, USA.

Kenington, "Linearised RF Amplifier and Transmitter Techniques", Microwave Engineering Europe, Nov. 1998, pp. 35-.

Mann, et al., "Increasing Talk-Time with Effecient Linear PAs", Presented at IEE Colloquim on Tetra Market and Technology Developments, Feb. 2000, London.

Mann, et al., "Increasing the Talk-Time of Mobile Radios with Effecient Linear Transmitter Architectures", Electronics & Communication Engineering Journal, Apr. 2001, pp. 65-76, vol. 13, No. 2.

Heimbach, "Digital Multimode Technology Redefines the Nature of RF Transmission", Applied Microwave & Wireless, Aug. 2001.

Swanson, "Digital AM Transmitters", IEEE Transactions on Broadcasting, Jun. 1989, vol. 35, No. 2.

Tropian-Products Main, www.tropian.com/products/, Copyright 2000-2001, Aug. 14, 2002.

"Tropian and Agilent Technologies announce collaboration on multiband, multi-mode 2.5G transmitter solutions", Feb. 18, 2002, Connes, France.

"Tropian Awarded 8th U.S. Patent for Wireless Technology: Innovative RF Power Processing Circuit Architecture Achieves Speed and Accuracy in Polar Modulation," Aug. 6, 2001, Cupertino, California.

Dialog Web Command Mode, p. 1 of 1, Sep. 17, 2002, Record 03929207, Polar Modulators for 1 and 2 GHz Power Amplifier Correction, Nisbet, J.

Dialog Web Command Mode, p. 1 of 1, Sep. 17, 2002, Record 0326082, A new Class-AB Design, De Jager, et al., Electronics World 105, Dec. 1999, p. 982-7.

Dialog Web Command Mode, p. 1 of 1, Sep. 17, 2002, Record 2371235, Increasing the talk-time of mobile radios with efficient linear transmitter architectures, Mann et al., Electronics & Communication Engineering Journal, v. 13, No. 2, Apr. 2001 (p. 65-76).

Dialog Web Command Mode, p. 1 of 3, Sep. 17, 2002, Record 15595216, The big climate amplifier ocean circulation-sea-ice-storminess-dustiness-albedo, Broecker, Geophysical Monograph, 2001, 126, 53-56, etc.

Dialog Web Command Mode, p. 1 of 9, Sep. 19, 2002, Record 10872787, Out-of-band emissions of digital transmissions using Kahn EER technique, Rudolph, IEEE Transactions on Microwave Theory & Techniques, 2002, V 50, N 8, Aug, p. 1979-1983, etc.

Dialog Web Command Mode, p. 1 of 20, Sep. 17, 2002. Record 01239474, GSM players Eye Edge Despite Transmit Woes, Keenan, Electronic Engineering Times, 2002, n 1211, p. 6.

Dialog Web Command Mode, p. 1 of 13, Sep. 17, 2002, Record 05993356, A fast adaptive polynomial predistorter for power amplifiers, Besbes et al., IEEE Global Telecommunications Conference, v 1, 2001, p. 659-663, etc.

Dialog Web Command Mode, p. 1 of 15, Sep. 17, 2002, Record 7300231, A fast adaptive polynomial predistorter for power amplifiers, Besbes et al., IEEE, 2001, 6 vol. 1, 3752 pp., etc.

Dialog Web Command Mode, p.1 of 20, Sep. 17, 2002, Record 01249474, GSM players eye Edge despite transmit woes, Keenan, Electronic Engineering Times, 2002, n 1211, p. 6, etc.

IEEE Standard Dictionary Of Electrical and Electronic Terms, 1984, p. 197.

* cited by examiner

APPARATUS, METHODS AND ARTICLES OF MANUFACTURE FOR LINEAR SIGNAL MODIFICATION

FIELD OF THE INVENTION

The invention relates generally to linear signal modification, and more particularly to linear signal amplification and attenuation.

BACKGROUND OF THE INVENTION

Modifying (amplifying or attenuating) electromagnetic signals is, generally speaking, a function of an electrical component or system. Modification may be useful in any number of systems, and is generally done by linear or non-linear techniques. Linear techniques generally provide an output signal with a relatively close resemblance, except for scale, to an input signal. Non-linear techniques generally provide an output signal, which does not have a relatively close resemblance to an input signal.

Either non-linear or linear amplifiers may be useful. Non-linear amplifiers may be useful for on/off amplification—that is, where there is no need to produce an accurate amplification of an input signal, but merely amplify a signal. Linear amplifiers may be useful where an accurate, amplified reproduction is desirable.

When accurate reproduction is desired, therefore, a linear amplifier has been desirable. However, the poor efficiency of a linear amplifier may make its use undesirable in some situations. Efficiency refers to the ability of the amplifier to translate DC power input into power output. A linear amplifier is less efficient than a non-linear amplifier because it draws more power than a non-linear amplifier to output a signal with the same strength. Moreover, a linear amplifier requires quiescent current, or current from a power source even when not amplifying. In applications with a limited power source, such as battery power, a non-linear amplifier may be desirable, as a non-linear amplifier typically requires very little or no quiescent current.

In some areas of signal processing, however, such as radio frequency (RF), non-linear techniques lead to less than desirable results. For example, although linear amplifiers are desirable in RF receivers because of their signal reproduction accuracy, the power draw required by linear amplifiers limits their usefulness, especially in portable, battery driven devices.

Attempts have been made in the art to overcome these difficulties. For example, amplifier combining—using multiple amplifiers to amplify the same signal—is one method that attempts to leverage linear and non-linear benefits. However such attempts to date have been constrained by various difficulties. For example, amplifier combining methods use components, such as transformers or quarter wave lines, to sum the output of the amplifiers in order to drive the load. These components add to the cost and size of the amplifier array.

Accordingly, it would be helpful to the art of signal modification if linear amplifier techniques could be used in combination with non-linear techniques in order to provide effective amplification techniques.

SUMMARY OF THE INVENTION

Embodiments of the present invention include apparatus, methods and articles of manufacture for linear signal modification. Preferred embodiments provide an amplifier that combines the relative precision of linear amplifiers with the relative efficiency and power draw of non-linear amplifiers.

The amplifier of the preferred embodiments comprises one or more non-linear current sources. The current sources are enabled and/or disabled when desired by one or more characteristics of an input signal. In the especially preferred embodiments, the output from the one or more current sources is combined to drive a load. If more than one current source is used, the current sources may be weighted to contribute different amounts of current to the output. By combining the outputs from the current source or sources, a linear amplification of a signal is provided. Additionally, linear attenuation is also possible in various embodiments.

DETAILED DESCRIPTION OF THE PREFERRED EMBODIMENTS

Embodiments of the present invention include apparatus, methods and articles of manufacture for linear signal modification. The term "signal" as used herein should be broadly construed to include any manner of conveying data from one place to another, such as, for example, an electric current or electromagnetic field, including without limitation, a direct current that is switched on and off or an alternating-current or electromagnetic carrier that contains one or more data streams. Data, for example, may be superimposed on a carrier current or wave by means of modulation, which may be accomplished in analog or digital form. The term "data" as used herein should also be broadly construed to comprise any type of intelligence or other information, such as, for example and without limitation, audio, such as voice, text and/or video, etc.

Figure 1:
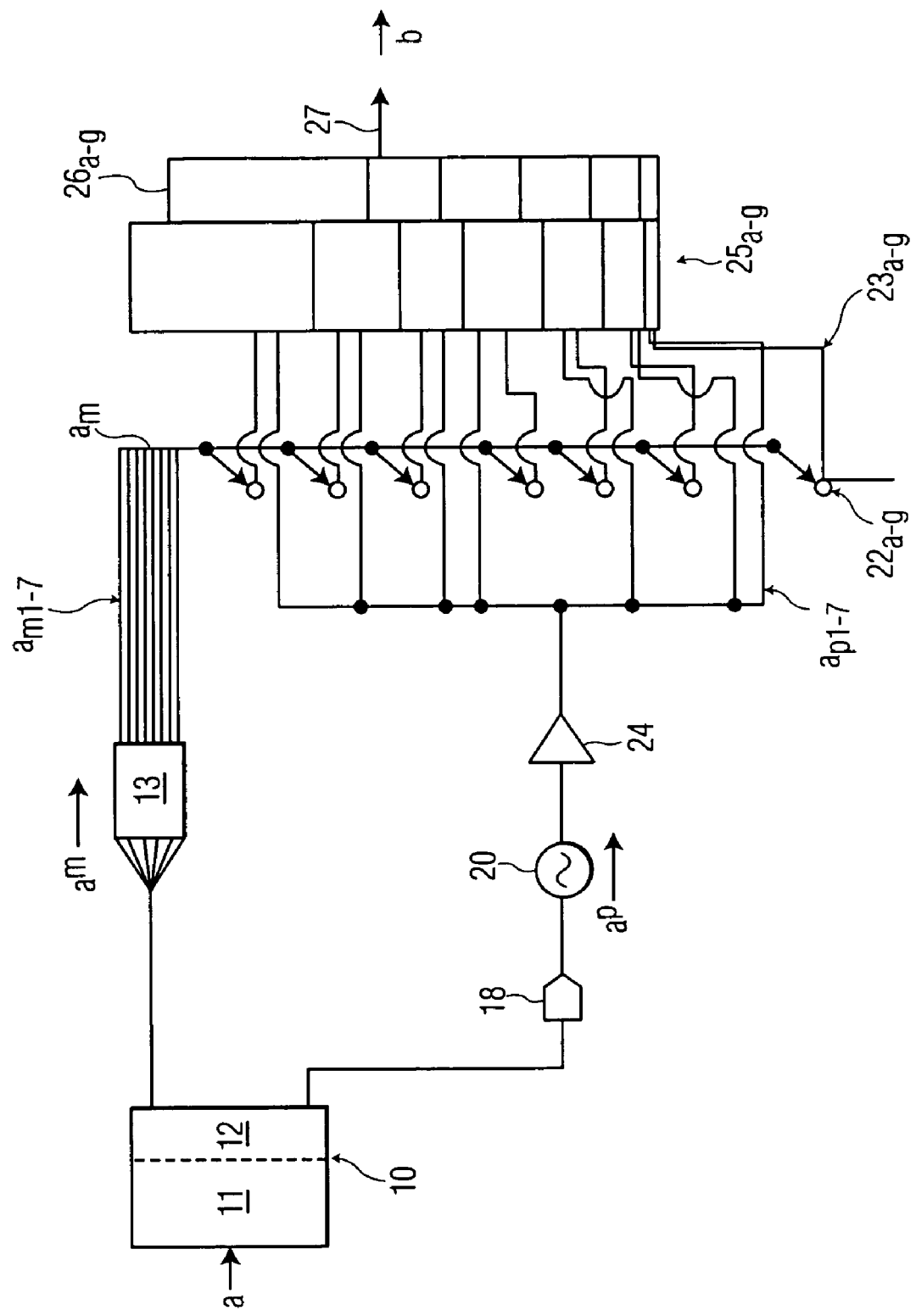
FIG. 1 shows a preferred embodiment.

FIG. 1 shows a preferred embodiment. An input signal a is provided to a Digital Signal Processor 10. Digital Signal Processor 10 comprises an Analog to Digital Converter 11, which digitizes the signal, for example, by the use of rectangular coordinates or I,Q data. Rectangular to Polar Converter 12 then receives the I,Q data and translates it into polar coordinates. It should be noted that, in other embodiments, a digitized representation of a signal may be provided to a rectangular to polar converter if desired. In those embodiments, the digitized representation may be generated in any of a number of ways as is known in the art. Also, while this embodiment is described as used in connection with a digitized signal and I,Q and polar data, those of ordinary skill in the art will appreciate that other embodiments are not limited thereto and may use any digital or analog wave form, or combination thereof Returning now to the embodiment of FIG. 1, Rectangular to Polar Converter 12 outputs a digitized signal in polar coordinates, which takes the form R, P(sin) and P(cos) for example. In this example, the R coordinate represents the amplitude characteristic of the signal. The P(sin) and P(cos) coordinates represent the phase characteristic of the signal. It should be noted that "characteristic," as used herein, refers to electromagnetic signal characteristics, such as frequency, voltage, amplitude (including magnitude and envelope), phase, current, wave shape, or pulse. Other embodiments may derive one or more signal characteristics from the input signal as desired.

Figure 2:
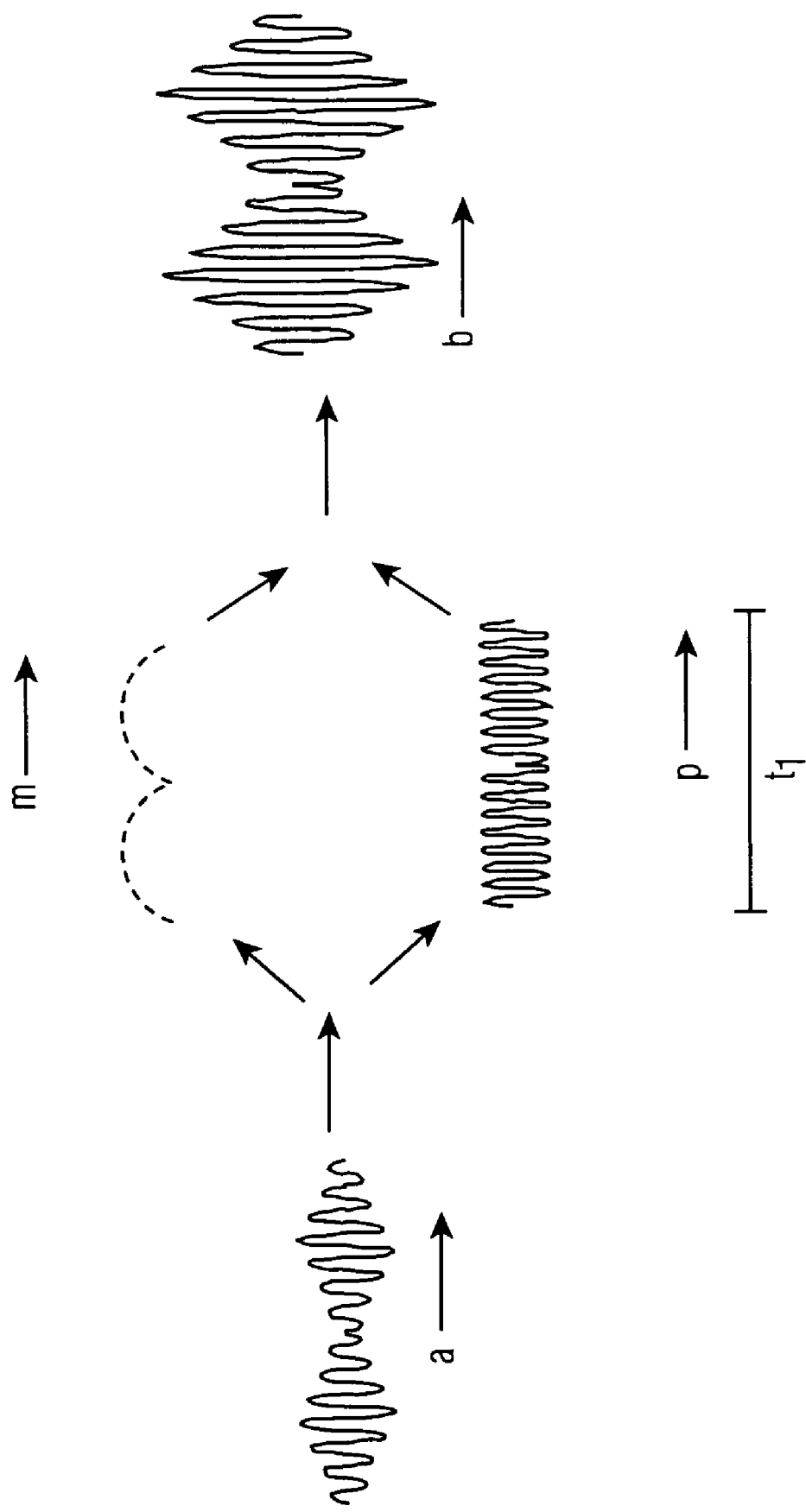
FIG. 2 shows a schematic diagram of operation of the embodiment of FIG. 1.

Turning briefly to FIG. 2, a schematic diagram of a signal that has been translated according to the embodiment of FIG. 1 is shown. Input signal a has been translated into magnitude component m comprising magnitude characteristics of the input signal over period $t_1$ and phase component p comprising phase characteristics on a carrier wave over the same period. Output signal b is shown after amplification by a preferred embodiment. It should be noted that the time period in this and other embodiments is as desired. For example, embodiments may derive magnitude and phase characteristics of a signal using various sampling rates in order to maximize resolution of the signal, maximize speed of operation, etc. These sampling rates may be dynamically determined as well in various embodiments so that they change during operation. In the preferred embodiments, the division of an input signal is synchronized, in order to maximize accuracy of output and minimize any distortion.

Returning now to FIG. 1, amplitude and phase characteristics are then transmitted through separate paths. The amplitude characteristics of the input signal are converted, via converter 13, along path $a^m$, into digital pulses comprising a digital word quantized into bits $B_0$ to $B_{n-1}$, with a Most Significant Bit ("MSB") to Least Significant Bit ("LSB"). The digital word may be of varying lengths in various embodiments. In general, the longer the word the greater the accuracy of reproduction of the input signal. The digital word provides instruction signals or controls for attenuation and/or amplification, in manner to be described further below. Of course, as is described further below, in other embodiments, a differently composed digital word may be used, as well as other types of derivation and/or provision of amplitude or other signal characteristics.

In the embodiment of FIG. 1, seven control component lines $a^m1$-$a^m7$ are shown leading away from the converter 13. The number of these control component lines depends, in the preferred embodiments, upon the resolution of the word. In this preferred embodiment, the word has a seven bit resolution. It should be noted in FIG. 1 that, for ease of viewing the figure, the control component lines are consolidated into a single path $a^m$ leading into control components 22a-g. However, in the embodiment, and as further described below, the control component lines are not consolidated and instead feed into the control components individually.

The phase characteristic travels along path $a^p$. Here the phase characteristic is first modulated onto a wave by way of Digital to Analog Converter 18 and Synthesizer 20 (which is a Voltage Controlled Oscillator in an especially preferred embodiment.) Synthesizer 20 provides an output wave, which is comprised of the phase information. This output wave has a constant envelope, i.e., it has no amplitude variations, yet it has phase characteristics of the original input wave, and passes to driver 24, and in turn driver lines $a^p1$-$a^p7$. The wave, which has been split among the driver lines, is then fed into current sources 25a-25g, and will serve to potentially drive current sources 25a-25g, as is further described below. In other embodiments, other sources of other wave characteristics, i.e., besides the phase characteristic, may be used.

It should be noted that, in the present embodiment, transistors may be used as current sources 25a-25g. Additionally, in other embodiments, one or more transistors segmented appropriately may be used as current sources 25a-25g. The current sources 25a-25g must not be configured to behave like voltage sources; for example, by saturating transistors, which will interfere with the desired current combining of the sources.

Path $a^m$ (comprised of control component lines $a^m1$-$a^m7$ as described above) terminates in control components 22a-g. In the especially preferred embodiment, these are switching transistors, and are preferably current sources, although, as further described below, in other embodiments, other sources of other wave characteristics may be used, as well as other regulation schemes. Control components 22a-g are switched by bits of the digital word output from the amplitude component and so regulated by the digital word output from the amplitude component. If a bit is "1" or "high," the corresponding control component is switched on, and so current flows from that control component to appropriate current source 25a-g along bias control lines 23a-g. As had been noted above, the length of the digital word may vary, and so the number of bits, control components, control component lines, driver lines, bias control lines, current sources, etc. may vary accordingly in various embodiments. Moreover, there does not have to be a one to one correspondence among digital word resolution, components, lines and current sources in various embodiments.

Current sources 25a-g receive current from a control component if the control component is on, and thus each current source is regulated according to that component. In the especially preferred embodiments an appropriate control component provides bias current to the current sources, as is described further below, and so the control component may be referred to as a bias control circuit, and a number of them as a bias network. In some embodiments, it may be desired to statically or dynamically allocate one or more bias control circuits to one or more current sources using a switching network if desired.

Returning now to the embodiment of FIG. 1, each current source serves as a potential current source, and is capable of generating a current, which is output to current source lines 26a-g respectively. Each current source may or may not act as a current source, and so may or may not generate a current, because it is regulated via the appropriate instruction signal, or digital word value regulating a control component. Activation of any segment, and generation of current from that segment, is dependant upon the value of the appropriate bit from the digital representation of the amplitude component regulating the appropriate control component. It should be noted that the current sources are not an amplifier or amplifiers, in the preferred embodiments, rather the plurality of current sources function as an amplifier, as is described herein. Indeed, amplification and/or attenuation may be considered in the preferred embodiments as functions of those embodiments, and so may an amplifier and/or attenuator be considered to be an electrical component or system that amplifies and/or attenuates.

The combined current, i.e. the sum of any current output from current sources 25a-g, is the current sources output. Thus the embodiment may act as an attenuator and/or amplifier. No further circuitry or components are necessary between current sources to combine current from each current source and so provide a useful output current. Therefore, the combined current, which is output on line 27, and shown as b, may be used as desired, e.g., as an amplifier, as an attenuator, to drive a load, etc.

In the preferred embodiments, the current sources vary in current output and size. This provides various weighting to the currents that are potentially supplied by those current sources. For example, in one preferred embodiment, a first current source is twice the size of a next current source, which in turn is twice the size of a next current source, and so on until a final current source. The number of current sources may be matched to the number of bits of the digital control word, so that the largest current source is controlled by the MSB of the amplitude word, the next bit of the word controls the next largest current source, etc., until the LSB, which is sent to the smallest current source. Of course, as had been noted above, other embodiments may have a different pattern of matching bit to current source, including use of a switching network. Moreover, in an especially preferred embodiment, duplicate current sources—of the same size—are provided, as well as current sources that vary in size. In yet other embodiments, other wave characteristics may be provided to other current sources and so regulate those sources.

It should be noted that, in the present invention, the current sources are biased non-linearly. Thus, any current source operates efficiently. In the preferred embodiments, therefore, power consumption is reduced. Additionally, as a result of current source regulation according to signal characteristics, as had been described above, the resultant output signal has a relatively accurate linearity and proportionality with the input signal. Thus, an amplifier may be provided in the preferred embodiments with the relative precision of linear operation combined with the relative efficiency and power consumption of non-linear operation.

For example, returning to the embodiment of FIG. 1, if one of current sources 25a-g is switched on, it will act as a non-linear current source with attendant relative efficiency. If the current source is off, the source draws little or no power. Linear characteristics are seen as well because each current source that is on provides current contribution in similar proportions to the amplitude characteristic of the input signal, and so a relatively precise reproduction of the input signal is provided.

The current sources 25a-g comprise, in the preferred embodiment of FIG. 1, one or more HBT transistors. Other transistors may be used as well, such as FETs, etc., as well as other current sources. Other components may be interposed as well, e.g., a variable gain amplifier or attenuator to reduce the drive current to the transistor segments, non-linear components along the amplitude path, etc.

Figure 3:
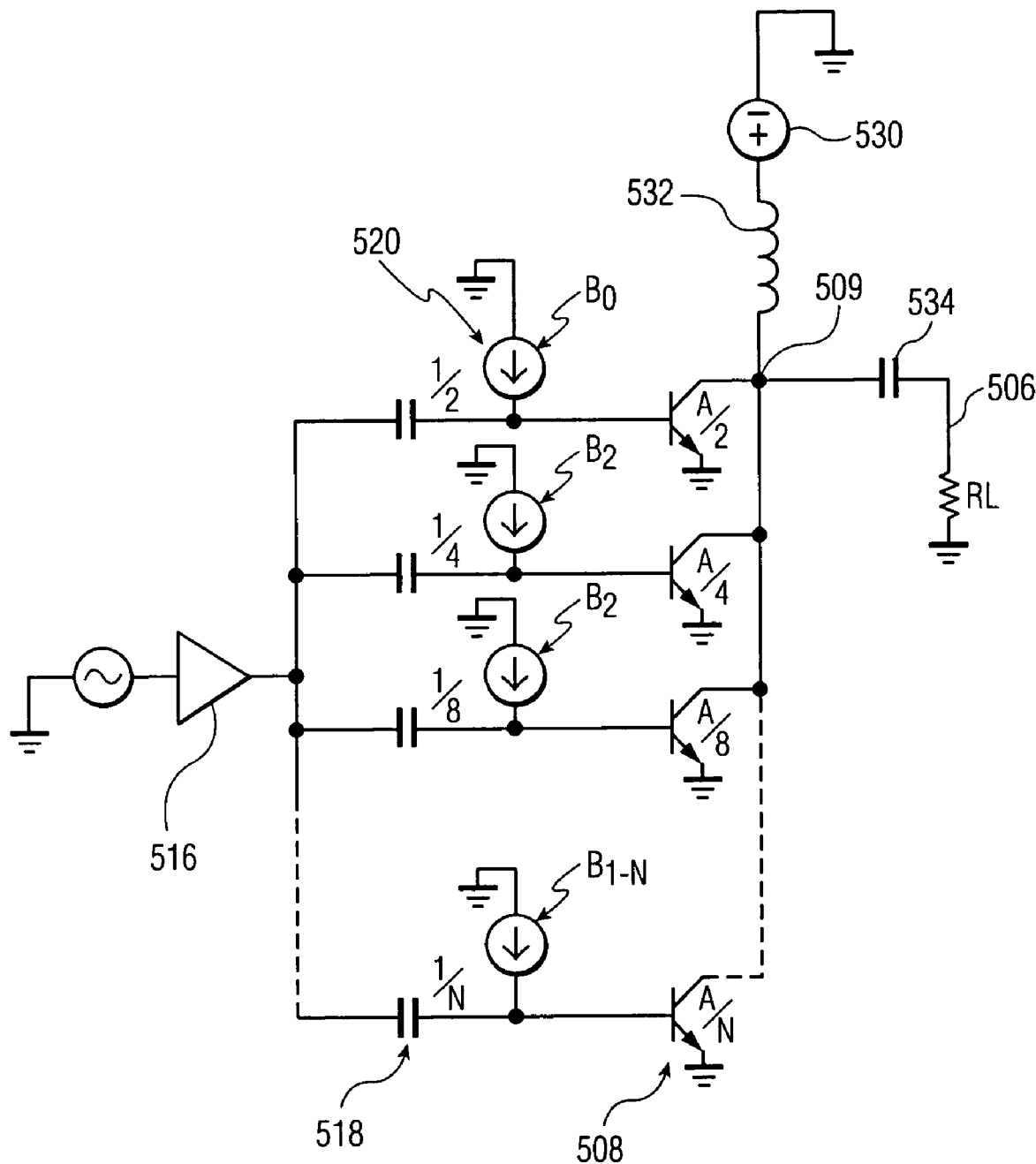
FIG. 3 shows a preferred embodiment.

FIG. 3 depicts another embodiment, such as might be used in a transmitter, in accordance with the present invention. Driver 516 introduces gain to a carrier signal. Driver 516 is coupled to one or more, and preferably, a plurality of current sources 508, optionally using capacitors 518. Current sources 508 are enabled or disabled according to bias current supplied by control components 520 in bias network $B_0$-$B_{n-1}$. In a preferred embodiment, control components 520 are conventional switched current sources and current sources 508 are transistors. One or more of the output currents of current sources 508 may be combined and input to a load 506, thus providing an amplified signal. In this embodiment, any current output from the current sources 508 is combined and input to load 506. If the combined load power is less than the input power, of course, the combined current sources act as an attenuator.

A voltage source 530 in this embodiment maintains a substantially constant DC potential at a node 509. An inductor 532 is included for inhibiting, and preferably, preventing instantaneous current changes in the circuit path containing voltage source 530, thereby allowing load 506 to be driven by the flow of current from current sources 508. Capacitor 534 can be provided as a DC block.

The phase characteristic is modulated by a carrier signal, preferably an RF signal. Current sources 508 are driven, preferably simultaneously, with the modulated carrier signal.

A non-linear driver may be used in this embodiment, because the carrier signal does not contain amplitude information. The output currents from the current sources are then added to obtain a substantially linear output signal, because, as had been described above, any currents can be directly combined at node 509, thus providing an amplified and/or attenuated signal, to drive load 506. The added currents, or output from the current sources, can be input directly to the load without the need for additional components, such as transformers or quarter-wave transmission lines.

In the embodiment of FIG. 3, each enabled current source contributes a binary-weighted current to the modified output signal and so to the load, so that current source 508 A/2 contributes twice the current when on as current source 508 A/4, current source 508 A/4 contributes twice the current when on as current source 508 A/8, etc., although, as should be understood, other suitable types of weighting may also be used where desired.

In this embodiment, current sources 508 A/2- A/N are enabled or disabled by biasing the current to each device and the control mechanism to select current sources for enablement uses the digital code created from the magnitude characteristic which are represented by digital control bits $B_0$ through $B_{n-1}$. Thus, instruction signals are input to current sources 508 A/2-A/N, thereby enabling or disabling each current source. However, it should be understood that the control mechanism for a current source may be a biasing current developed by a corresponding switched current source that is supplied to a control terminal of a current source, such as, for example, the base of a transistor.

In accordance with the preferred embodiments, the amplitude characteristic is preferably digitized. In one embodiment, the peak amplitude is set equal to the full scale of the digitization (i.e. when all bits are set high) to improve linearity. Alternatively, the peak amplitude may be set to other than the full scale (i.e. greater or lesser) of the digitization. If the peak amplitude is set lesser than the full scale, an increase in gain may exist because the average output power level is increased for a given power level of the phase modulated carrier signal.

The use of the preferred embodiments may provide a capability for wide band amplitude modification in an associated transmitter because it makes possible linear amplification and/or attenuation across a relatively large frequency spectrum, due to the relatively low input capacitance. Thus, embodiments may be used for cellular and other transmitters, as is described further herein.

Advantageously, embodiments of the present invention may improve efficiency over conventional power amplification, because linearity of the transmission is not dependent on the linearity of the amplifier, but instead depends only on how linearly the currents add to the load. Accordingly, each current source can be biased as a non-linear current source, such as Class B or C, to maximize the efficiency. Efficiency may further be improved because there is little or no quiescent current draw for disabled current sources.

In the illustrated embodiments, power control may readily be achieved because the output current is dependent primarily on the signal drive level. Increasing or decreasing the signal drive level, for example, with a variable gain amplifier or attenuator, causes a corresponding increase or decrease in the output current. In addition, an increase or decrease of the bias to the drive controller, also causes a respective increase or decrease in the output current.

As should be understood, any suitable types of current sources, for example, other transistor segments and/or formats as well as other devices or methods, may be used with any of the embodiments of the present invention where desired.

Figure 4A:
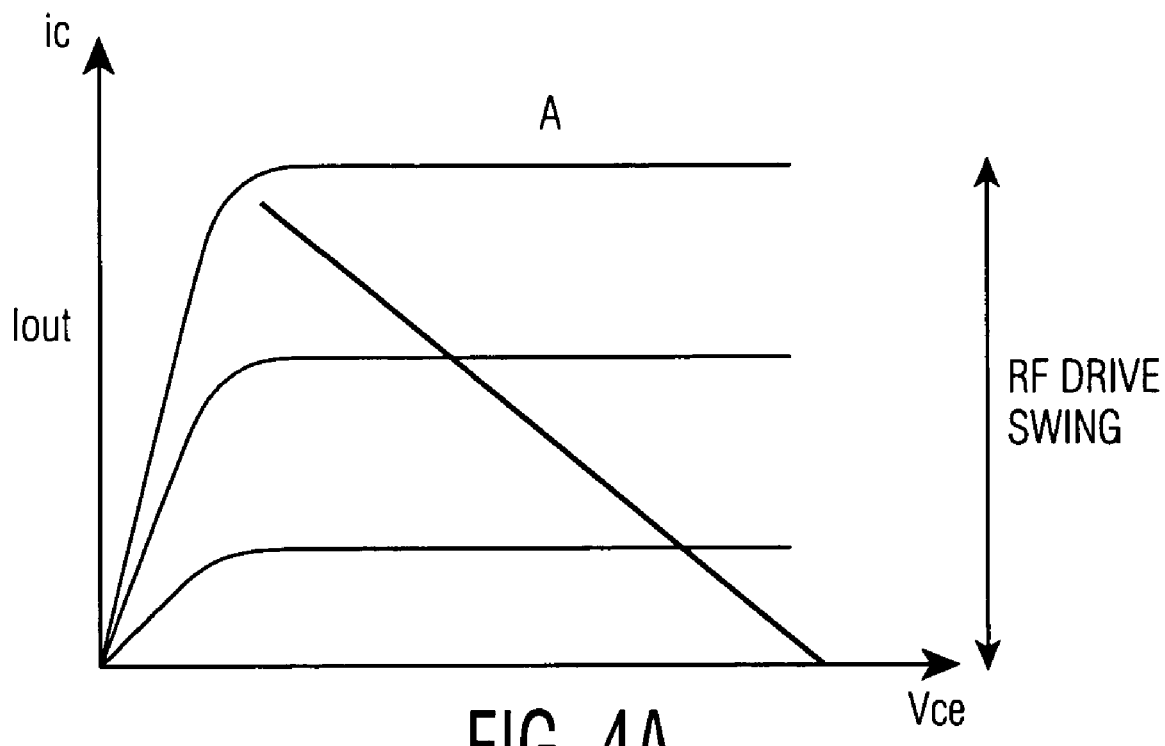
FIGS. 4A-B depict output characteristics for current sources with areas A and A/2, respectively.
Figure 4B:
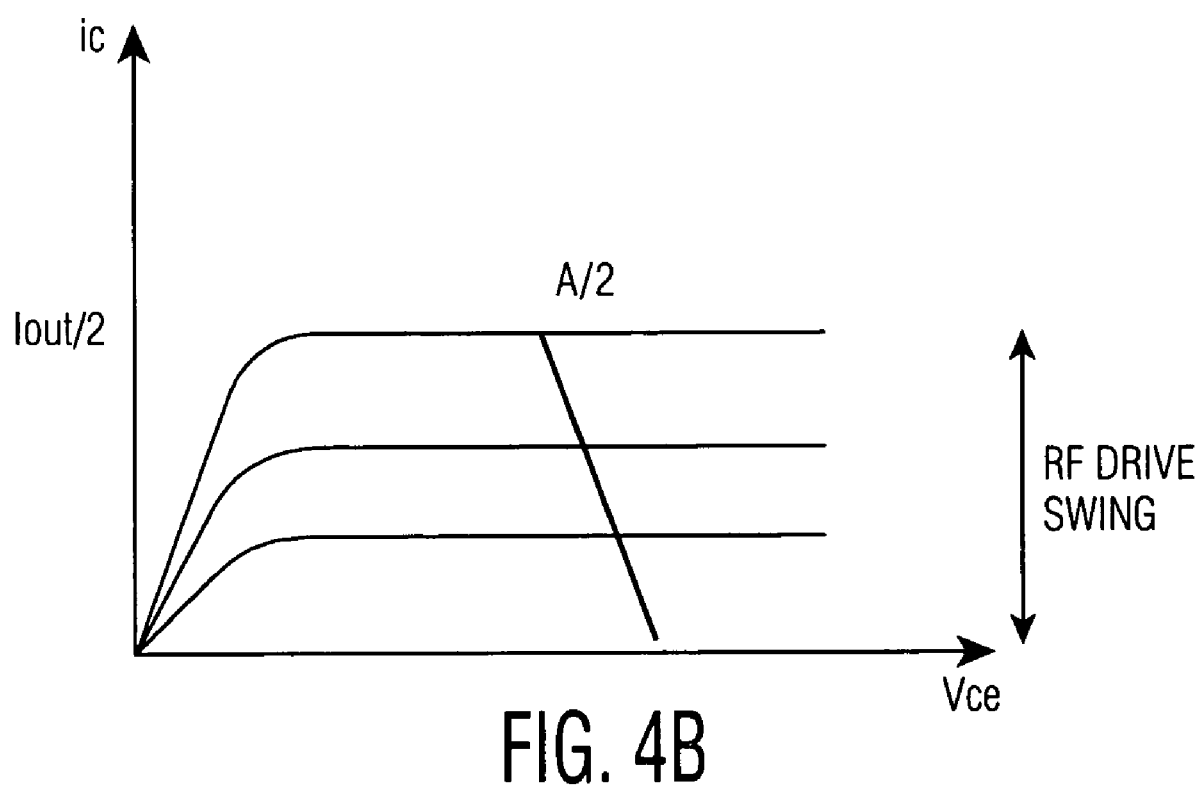

In the preferred embodiments, fabricated as a single integrated circuit, weighting may be achieved by providing segments having different semiconductor areas. FIGS. 4A-B depict output characteristics (i.e. load lines) for two segments having areas A and A/2 respectively. When the area of a segment is reduced in size by half, the current supplied by the segment to the load is also reduced in half. This is because the smaller segment has half the current density of the larger segment.

Amplifiers according to embodiments of the invention can provide a direct digital interface for baseband DSP functions. The amplifiers also may be dynamically programmed to accommodate multiple modulation formats and wireless network standards. An advantage is that cost and size of devices using an amplifier based on this aspect of the invention can be reduced. Furthermore, the output current combines into the load to develop a voltage that can be an analog representation of the amplitude characteristic, so that the amplifier also performs a digital-to-analog conversion.

Various types of system architectures may be utilized for constructing the embodiments of the present invention. One of ordinary skill in the art will accordingly appreciate that embodiments of the invention or various components and/or feature thereof may be entirely comprised of hardware, software or may be a combination of software and hardware. The embodiments or various components may also be provided on a semiconductor device where desired, such as an integrated circuit or an application-specific integrated circuit composition; some examples include silicon (Si), silicon germanium (SiGe) or gallium arsenide (GaAs) substrates.

Various embodiments may modify various parameters without departing from the spirit and scope of the present invention. For example, the length of the digital word may be longer or shorter in various embodiments, which may provide a more or less precise digitization of the wave. As other examples, as was described further above, the number of bits, control components, control component lines, driver lines, bias control lines, current sources, etc., may all be varied as desired.

While the invention has been described by illustrative embodiments, additional advantages and modifications will occur to those skilled in the art. Therefore, the invention in its broader aspects is not limited to specific details shown and described herein. Modifications, for example, may be made without departing from the spirit and scope of the invention. In addition, preferred embodiments may include amplifiers that are specialized for particular input signals, carrier waves and output signals e.g. embodiments may be used in various RF, microprocessor, microcontroller and/or computer devices, e.g. cell phones, such as CDMA, CDMA2000, W-CDMA, GSM, TDMA, as well as other wired and wireless devices, e.g. Bluetooth, 802.11a, -b, -g, radar, 1×RTT, two-way radios, GPRS, computers and computer communication devices, PDA's and other handheld devices, etc. Accordingly, it is intended that the invention not be limited to the specific illustrative embodiments, but be interpreted within the full spirit and scope of the appended claims and their equivalents.

We claim:

1. A method of signal modification comprising: generating a modification of an input signal, via a plurality of non-linear current sources regulated by a characteristic of said input signal, wherein the plurality of non-linear current sources are neither amplifiers nor current sources configured to function as voltage sources, and wherein said characteristic of said input signal comprises a magnitude characteristic over time, t, that is converted to a control signal having a plurality of signal portions, each of said signal portions for regulating at least one of the plurality of non-linear current sources, wherein said plurality of non-linear current sources is comprised of a first non-linear current source and second non-linear current source and wherein any regulated outputs of said first non-linear current source and said second non-linear current source are combined to comprise a linear output signal.

2. A method as in claim 1 further comprising: providing an input signal to said plurality of non-linear current sources.

3. The method of claim 1 wherein said control signal is a carrier signal modulated by said converted magnitude characteristic.

4. The method of claim 3 wherein said control signal is an instruction signal created from said converted magnitude characteristic.

5. The method of claim 4 wherein the instruction signal individually regulates the plurality of the current sources by causing at least one of the current sources to generate a current.

6. The method of claim 4 wherein the characteristic of said input signal is an amplitude characteristic.

7. The method of claim 6 wherein the amplitude characteristic is digitized such that its peak magnitude is substantially equal to the full scale of the digitization.

8. The method of claim 6 wherein the amplitude characteristic is digitized such that its peak magnitude is less than the full scale of the digitization.

9. The method of claim 4 wherein the instruction signal is a digital code.

10. The method of claim 4 wherein the instruction signal represents an instantaneous amplitude of the input signal.

11. The method of claim 4 wherein the instruction signal one of enables and disables the current sources.

12. The method of claim 3 wherein the modulated carrier signal drives the plurality of non-linear current sources simultaneously.

13. The method of claim 3 wherein a non-linear driver drives the plurality of non-linear current sources.

14. The method of claim 1 wherein the output signal is an amplification of the input signal.

15. The method of claim 1 wherein the input signal is a radio frequency signal.

16. The method of claim 1 wherein said at least a first non-linear current source and said at least a second non-linear current source comprises a heterojunction bipolar transistor.

17. The method of claim 1 wherein said at least a first non-linear current source and said at least a second non-linear current source comprises a field effect transistor.

18. The method of claim 1 wherein said at least a first non-linear current source and said at least a second non-linear current source comprises a bipolar junction transistor.

19. The method of claim 1 wherein power of the input signal is varied.

20. A method for amplification or attenuation comprising:
operating at least a first non-linear current source and at least a second non-linear current source, wherein the first and second non-linear current sources are neither amplifiers nor current sources configured to function as voltage sources; and combining any regulated current generated by said first and second non-linear current sources in order to generate at least one of a linear amplification and a linear attenuation of an input wave.

21. The method of claim 20 wherein said first and second non-linear current sources are weighted so as to contribute different amounts of current to the output signal.

22. The method of claim 21 wherein said first and second non-linear current sources are binary weighted.

23. A method of signal modification comprising: generating a modification of an input signal, via a plurality of non-linear current sources regulated by a characteristic of said input signal, wherein the plurality of non-linear current sources are neither amplifiers nor current sources configured to function as voltage sources, and wherein said characteristic of said input signal comprises a magnitude characteristic over time, t, that is converted to a control signal having a plurality of signal portions, each of said signal portions for regulating at least one of the plurality of non-linear current sources, wherein the characteristic of said input signal comprises polar coordinates (R, θ).

24. An apparatus for linear signal generation comprising: means for providing a plurality of current sources which are neither amplifiers nor are they configured to function as voltage sources; and means for regulating said plurality of current sources to operate non-linearly utilizing a control signal converted from a magnitude characteristic of an input signal and generating a linear output signal, said control signal having a plurality of signal portions, each of said signal portions for regulating at least one of the plurality of non-linear current sources, wherein the output signal is an amplification of the input signal.

25. An apparatus for signal modification comprising: means for generating a modification of an input signal, via a plurality of non-linear current sources regulated by a characteristic of said input signal, wherein the plurality of non-linear current sources are neither amplifiers nor current sources configured to function as voltage sources and the plurality of non-linear current sources comprises a first non-linear current source and second non-linear current source and wherein any regulated outputs of said first non-linear current source and said second non-linear current source are combined to comprise a linear output signal, and wherein said characteristic of said input signal comprises a magnitude characteristic that is converted into a control signal having a plurality of signal portions, each of said signal portions for regulating at least one of the plurality of non-linear current sources, wherein the plurality of current sources is regulated by means for driving at least one of the current sources with a carrier signal, wherein said carrier signal is modulated by said control signal.

26. An apparatus as in claim 25 further comprising: means for providing an input signal to the plurality of non-linear current sources.

27. An apparatus as in claim 25 wherein said first and second non-linear current sources are weighted so as to contribute different amounts of current to the output signal.

28. An apparatus as in claim 27 wherein said first and second non-linear current sources are binary weighted.

29. An apparatus as in claim 25 wherein said at least a first non-linear current source and said at least a second non-linear current source further comprises a heterojunction bipolar transistor.

30. An apparatus as in claim 25 wherein said at least a first non-linear current source and said at least a second non-linear current source comprises a field effect transistor.

31. An apparatus as in claim 25 wherein said at least a first non-linear current source and said at least a second non-linear current source comprises a bipolar junction transistor.

32. An apparatus as in claim 25 wherein said means for generating a modification of an input signal, via a plurality of non-linear current sources regulated by a characteristic of said input signal further comprises means for regulating a plurality of control components by said characteristic of said input signal, which control components each regulate a corresponding one of the non-linear current sources.

33. An apparatus as in claim 25 wherein the plurality of current sources is regulated by an instruction signal, wherein said instruction signal is created from said control signal.

34. An apparatus as in claim 33 wherein the instruction signal individually regulates the plurality of current sources by causing at least one of the current sources to generate a current.

35. An apparatus as in claim 33 wherein the characteristic of said input signal is an amplitude characteristic.

36. An apparatus as in claim 35 wherein the amplitude characteristic is digitized such that its peak magnitude is substantially equal to the full scale of the digitization.

37. An apparatus as in claim 35 wherein the amplitude characteristic is digitized such that its peak magnitude is less than the full scale of the digitization.

38. An apparatus as in claim 33 wherein the instruction signal is a digital code.

39. An apparatus as in claim 33 wherein the instruction signal represents an instantaneous amplitude of the input signal.

40. An apparatus as in claim 33 wherein the instruction signal one of enables and disables the current sources.

41. An apparatus as in claim 25 wherein the modulated carrier signal drives the current sources simultaneously.

42. An apparatus as in claim 25 wherein the input signal is a radio frequency signal.

43. An apparatus as in claim 25 wherein said means for driving at least one of the current sources with a carrier signal modulated by said control signal further comprises a non-linear driver.

44. An apparatus as in claim 25 wherein power of the input signal is varied.

45. An apparatus for amplification or attenuation comprising: a first current source and a second current source operating non-linearly in response to a converted magnitude characteristic of an input signal, said first and second current sources being neither amplifiers nor current sources configured to function as voltage sources; and means for combining any a regulated current generated by said first and second current sources in order to generate at least one of a linear amplification and a linear attenuation of an input wave.

46. An apparatus for signal modification comprising: means for generating a modification of an input signal, via a plurality of non-linear current sources regulated by a characteristic of said input signal, wherein the plurality of non-linear current sources are neither amplifiers nor current sources configured to function as voltage sources, and wherein said characteristic of said input signal comprises a magnitude characteristic that is converted into a control signal having a plurality of signal portions, each of said signal portions for regulating at least one of the plurality of non-linear current sources, wherein the characteristic of said input signal comprises polar coordinates (R, θ).

47. An integrated circuit for electromagnetic processing comprising: a converter for providing an amplitude characteristic and a phase characteristic in synchronization; and a transistor capable of generating a current via at least one non-linear current source regulated by a characteristic of an input signal comprising a converted magnitude characteristic that is based on said amplitude characteristic over time, t, said transistor for receiving said converted magnitude characteristic and said phase characteristic, said at least one non-linear current source being neither an amplifier nor a current source configured to function as voltage source.

48. A method for signal processing comprising: operating at least first and second transistors in an unsaturated state so as to act as non-voltage current sources utilizing a converted magnitude characteristic of an input signal for individually regulating said transistors; combining any regulated currents generated by said at least first and second transistors in order to generate at least one of an amplification and an attenuation of said input signal.

49. An apparatus for processing an input signal comprising: at least first and second transistors operated in an unsaturated state so as to act as non-voltage current sources utilizing a converted magnitude characteristic of an input signal for individually regulating said transistors, said at least first and second transistors being operatively associated with one another so that any current generated by said at least first and second transistors are combined, wherein said at least first and second transistors are capable of generating an output signal that is an amplification of the input signal at certain times and an attenuation of the input signal at certain other times.

50. A method of signal modification comprising: generating a modification of an input signal, via combining at least first and second non-linear current sources regulated by a characteristic of said input signal, wherein the at least first and second non-linear current sources are neither an amplifiers nor current sources configured to function as a voltage source, and wherein said characteristic of said input signal comprises a magnitude characteristic over time, t, that is converted to an instruction signal modulated on a carrier wave.

\* \* \* \* \*